(12) United States Patent
Bauer et al.

(10) Patent No.: US 8,834,966 B2
(45) Date of Patent: Sep. 16, 2014

(54) COATED MICROFLUIDIC DEVICES AND METHODS OF MAKING

(75) Inventors: Wolfgang Andreas Bauer, Cambridge (GB); Wilhelm T. S. Huck, Cambridge (GB); Martin Fischlechner, Cambridge (GB)

(73) Assignee: Cambridge Enterprise Limited, Cambridgeshire (GB)

( * ) Notice: Subject to any disclaimer, the term of this patent is extended or adjusted under 35 U.S.C. 154(b) by 185 days.

(21) Appl. No.: 13/381,791

(22) PCT Filed: Jul. 2, 2010

(86) PCT No.: PCT/GB2010/051092
§ 371 (c)(1),
(2), (4) Date: Feb. 21, 2012

(87) PCT Pub. No.: WO2011/001185
PCT Pub. Date: Jan. 6, 2011

(65) Prior Publication Data
US 2012/0168010 A1 Jul. 5, 2012

(30) Foreign Application Priority Data
Jul. 3, 2009 (GB) .................................. 0911572.6

(51) Int. Cl.
*B81C 1/00* (2006.01)
*B05D 7/22* (2006.01)
*B05C 7/04* (2006.01)
*B01L 3/00* (2006.01)

(52) U.S. Cl.
CPC .............. *B81C 1/00206* (2013.01); *B05D 7/22* (2013.01); *B05C 7/04* (2013.01); *B05D 7/222* (2013.01); *B81B 2201/058* (2013.01); *B81C 1/00119* (2013.01); *B81B 2201/05* (2013.01); *B01J 2219/00511* (2013.01); *B01J 2219/0059* (2013.01); *B01J 2219/00637* (2013.01); *B01J 2219/00783* (2013.01); *B01J 2219/00788* (2013.01); *B01J 2219/00831* (2013.01); *B01J 2219/00833* (2013.01); *B01J 2219/00837* (2013.01); *B01J 2219/0097* (2013.01); *B01L 3/502707* (2013.01); *B01L 2300/16* (2013.01); *B81B 2201/0214* (2013.01); *B81B 2201/052* (2013.01)
USPC .......................................... 427/230; 427/235

(58) Field of Classification Search
CPC .......... B01L 3/502707; B01L 2300/16; B81C 1/00119; B81C 1/00206; B01J 2219/00511; B01J 2219/0059; B01J 2219/00637; B81B 2201/0214; B81B 2201/05; B81B 2201/058; B05D 7/22; B05D 7/222; B05C 7/04; B05C 13/06
USPC ............................................... 427/230, 238
See application file for complete search history.

(56) References Cited
U.S. PATENT DOCUMENTS

| | | | |
|---|---|---|---|
| 6,402,918 B1 | 6/2002 | Schlenoff et al. | |
| 6,860,980 B2 | 3/2005 | Locascio et al. | |
| 2002/0053514 A1 | 5/2002 | Locascio et al. | |
| 2004/0084312 A1 | 5/2004 | Warner et al. | |
| 2006/0019263 A1 | 1/2006 | Quake et al. | |

FOREIGN PATENT DOCUMENTS

WO WO-2005/052035 6/2005

OTHER PUBLICATIONS

Katayama et al., "Stable Cationic Capillary Coating with Successive Multiple Ionic Polymer Layers for Capillary Electrophoresis," Anal. Chem. 1998, 70, 5272-5277.*
A. R. Abate, D. A. Weitz, Small 2009, 5, 2030.
C. Holtze, A. C. Rowat, J. J. Agresti, J. B. Hutchison, F. E. Angilé, C. H. J. Schmitz, S. Köster, H. Duan, K. J. Humphry, R. A. Scanga, J. S. Johnson, D. Pisignano and D. A. Weitz, Lab Chip 2008, 8, 1632.
G. Decher, J. D. Hong, J. Schmitt, Thin Solid Films, 1992, 210/211, 831-835; G. Decher, Y. Lvov, J. Schmitt, Thin Solid Films, 1994, 244, 772-777; G. Decher, Science, 1997, 277, 1232-1237.
Graul T W et al: "Capillaries Modified by Polyelectrolyte Multilayers for Electrophoretic Separations" Analytical Chemistry, American Chemical Society, US LNKD-DOI: 10.1021/AC990277L, vol. 71, No. 18, Sep. 15, 1999, pp. 4007-4013, XP000854150, ISSN: 0003-2700.
H. Katayama, Y. Ishihama, N. Asakawa, Anal. Chem., 1998, 70, 5272-5277.
International Search Report and Written Opinion dated Dec. 7, 2010 as received in corresponding PCT Application No. PCT/GB2010/051092, 17 pages.
K.W.Ro, W.-J. Chang, H. Kim, Y.-M. Koo, J. H. Hahn, Electrophoresis, 2003, 24, 3253-3259.
Katayama H et al: "Stable Capillary Coating With Successive Multiple Ionic Polymer Layers" Analytical Chemistry, American Chemical Society, US LNKD-DOI: 10. 1021/AC9708755, vol. 70, Jan. 1, 1990, pp. 2254-2260, XP000955118, ISSN: 0003-2700.
Londe G et al: "Microfluidic valves based on superhydrophobic nanostructures and switchable thermosensitive surface for lab-on-a-chip (LOC) systems" Sensors and Actuators B, Elsevier Sequoia S.A., IAUSANNE, CH LNKD-DOI: 10.1016/J.SNB.2007.10.052, vol. 132, No. 2, Jun. 16, 2008, pp. 431-438, XP022707533 ISSN: 0925-4005 [retrieved on Nov. 4, 2007] p. 433, paragraph 2.2.4.
S. L. R. Barker, D. Ross, M. J. Tarlov, M. Gaitan, L. E. Locascio, Anal. Chem., 2000, 72, 5925-5929.

(Continued)

Primary Examiner — William Phillip Fletcher, III
(74) Attorney, Agent, or Firm — Foley & Lardner LLP

(57) ABSTRACT

We describe a method of layer-by-layer deposition of a plurality of layers of material onto the wall or walls of a channel of a microfluidic device, the method comprising: loading a tube with a series of segments of solution, a said segment of solution bearing a material to be deposited; coupling said tube to said microfluidic device; and injecting said segments of solution into said microfluidic device such that said segments of solution pass, in turn, through said channel depositing successive layers of material to perform said layer-by-layer deposition onto said wall or walls of said channel. Embodiments of the methods are particularly useful for automated surface modification of plastic, for example PDMS (Poly (dimethylsiloxane)), microchannels. We also describe methods and apparatus for forming double-emulsions.

13 Claims, 4 Drawing Sheets

(56) References Cited

OTHER PUBLICATIONS

S. L. R. Barker, M. J. Tarlov, H. Canavan, J. J. Hickman, L. E. Locascio, Anal. Chem., 2000, 72, 4899-4903.

Y. Liu, J. C. Fanguy, J. M. Bledsoe, C. S. Henry, Anal. Chem., 2000, 72, 5939-5944.

A. R. Abate and D. A. Weitz; "High-Order Multiple Emulsions Formed in Poly(dimethylsiloxane) Microfluidics", Small 2009, 5, No. 18, 2030-2032.

C. Holtze, A. C. Rowat, J. J. Agresti, J. B. Hutchison, F. E. Angilé, C. H. J. Schmitz, S. Köster, H. Duan, K. J. Humphry, R. A. Scanga, J. S. Johnson, D. Pisignano and D. A. Weitz; "Biocompatible Surfactants for Water-In-Fluorocarbon Emulsions", Lab Chip 2008, 8(10), 1632-1639.

G. Decher, J. D. Hong, J. Schmitt; "Buildup of Ultrathin Multilayer Films by a Self-Assembly Process: III. Consecutively Alternating Adsorption of Anionic and Cationic Polyelectrolytes on Charged Surfaces", Thin Solid Films, 210/211, (1992), 831-835.

G. Decher, Y. Lvov, J. Schmitt; "Proof of Multilayer Structural Organization in Self-Assembled Polycation-Polyanion Molecular Films", Thin Solid Films, 244, (1994), 772-777.

G. Decher; "Fuzzy Nanoassemblies: Toward Layered Polymeric Multicomposites", Science, 277, Aug. 29, 1997, 1232-1237.

Graul T W et al; "Capillaries Modified by Polyelectrolytes Multilayers for Electrophoretic Separations", Analytical Chemistry, American Chemical Society, US LNKD-D0I: 10.1021/AC990277L, vol. 71, No. 18, Sep. 15, 1999, pp. 4007-4013, XP000854150, ISSN: 0003-2700.

H. Katayama, Y. Ishihama, N. Asakawa; "Stable Cationic Capillary Coating With Successive Multiple Ionic Polymer Layers for Capillary Electrophoresis", Anal. Chem., 1998, 70, 5272-5277.

K.W.Ro, W-J. Chang, H. Kim, Y.-M. Koo, J. H. Hahn; "Capillary Electrochromatography and Preconcentration of Neutral Compounds on Poly(dimethylsiloxane) Microchips", Electrophoresis, 2003, 24, 3253-3259.

Katayama H et al; "Stable Capillary Coating With Successive Multiple Ionic Polymer Layers", Analytical Chemistry, American Chemical Society, US LNKD-DOI: 10. 1021/AC9708755, vol, 70, Jan. 1, 1990, pp. 2254-2260, XP000955118, ISSN: 0003-2700.

Londe G et al; "Microfluidic valves based on superhydrophobic nanostructures and switchable thermosensitive surface for lab-on-a-chip (LOC) systems", Sensors and Actuators B, Elsevier Sequoia S.A., lausanne, CH LNKD-DOI: 10.1016/J.SNB.2007.10.052, vol. 132, No. 2, Jun. 16, 2008, pp. 431-438, XP022707533 ISSN: 0925-4005 [retrieved on Nov. 4, 2007] p. 433, paragraph 2.2.4.

S. L. R. Barker, D. Ross, M. J. Tarlov, M. Gaitan, L. E. Locascio; "Control of Flow Direction in Microfluidic Devices With Polyelectrolyte Multilayers", Anal. Chem., 2000, 72, 5925-5929.

S. L. R. Barker, M. J. Tarlov, H. Canavan, J. J. Hickman, L. E. Locascio; "Plastic Microfluidic Devices Modified With Polyelectrolyte Multilayers", Anal. Chem., 2000, 72, 4899-4903.

Y. Liu, J. C. Fanguy, J. M. Bledsoe, C. S. Henry; Dynamic Coating Using Polyelectrolyte Multilayers for Chemical Control of Electroosmotic Flow in Capillary Electrophoresis Microchips, Anal. Chem., 2000, 72, 5939-5944.

\* cited by examiner

Figure 2
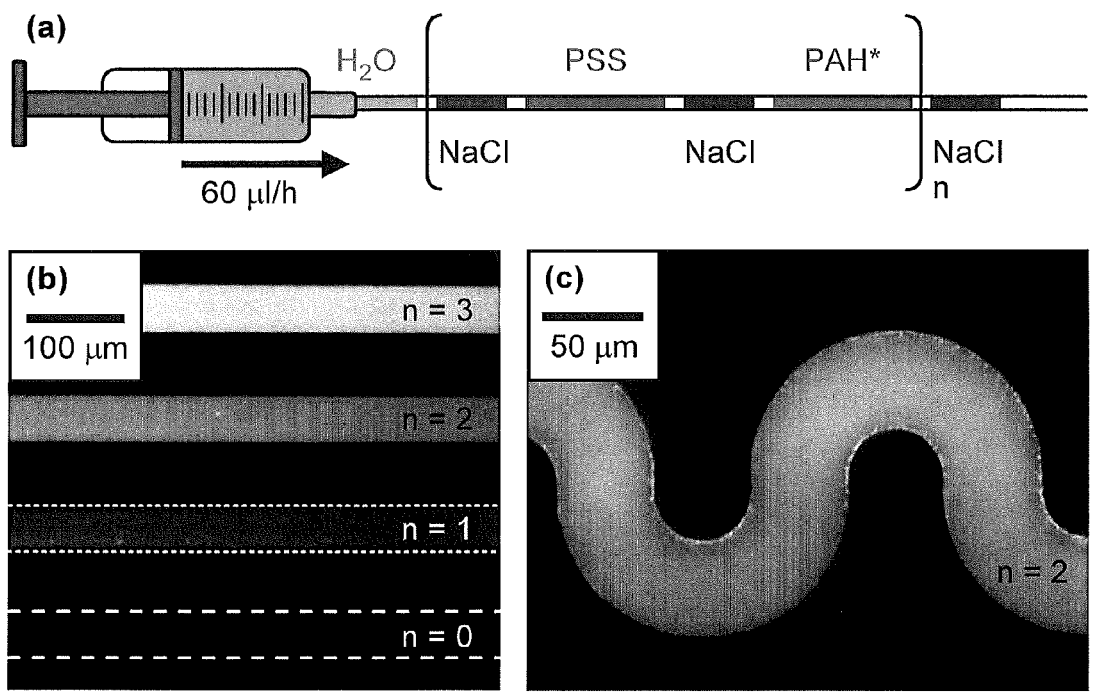
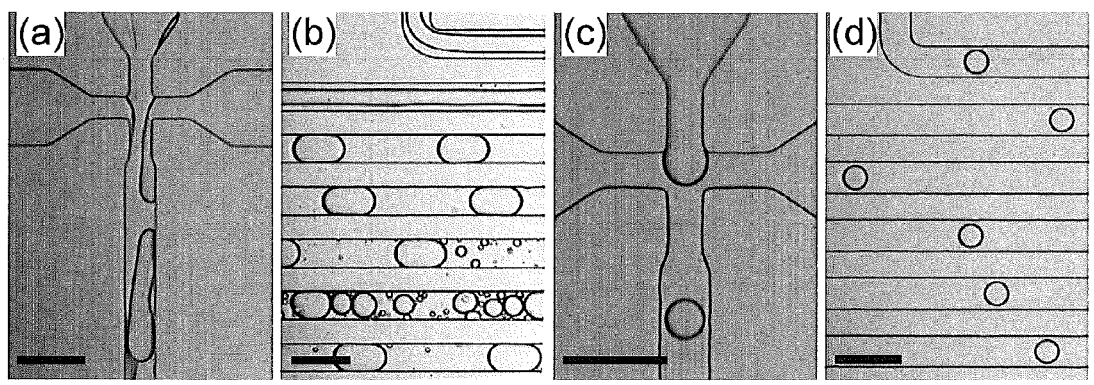
Figure 3

US 8,834,966 B2

COATED MICROFLUIDIC DEVICES AND METHODS OF MAKING

CROSS REFERENCE TO RELATED APPLICATIONS

The present invention is a National Stage of International Application No. PCT/GB2010/051092 filed on Jul. 2, 2010, which claims the benefit of United Kingdom Patent Application No. 0911572.6 filed on Jul. 3, 2009. The entire disclosures of which are incorporated herein by reference.

FIELD OF THE INVENTION

This invention relates to methods for modification of the surfaces of a channel of a microfluidic device, to apparatus for performing such methods, and to microfluidic devices fabricated using or treated by such methods. Embodiments of the methods are particularly useful for automated surface modification of plastic, for example PDMS (Poly(dimethylsiloxane)), microchannels.

BACKGROUND TO THE INVENTION

For several reasons poly(dimethylsiloxane) (PDMS) is one of the most commonly used materials in microfluidic chip fabrication. Compared to silicon and glass devices, PDMS based chips can be manufactured much faster, easier and cheaper by means of soft lithography. Due to its elasticity pumps and valves can be introduced into PDMS devices. Furthermore, PDMS can be cured at low temperature, it is transparent down to 280 nm, biologically inert and non-toxic as well as permeable to gases. It also readily seals with other materials, such as glass and poly(methyl methacrylate), which allows for the fabrication of hybrid chips. However, significant limitations concerning the application of PDMS in microfluidic devices arise from the high hydrophobicity of the material. For instance, the creation of oil-in-water emulsions inside microfluidic chips requires an effective wetting of the microchannel walls with the continuous aqueous phase. Therefore, a surface modification is often necessary, although rather challenging because of the inertness of PDMS.

In literature numerous ways of PDMS surface modification can be found. One possible approach comprises the exposure of PDMS to various energy sources, such as oxygen plasma. In this context, the generation of hydrophilic surfaces by oxidation is only temporary though since PDMS is known to regain its original hydrophobic surface properties over time, a phenomenon referred to as hydrophobic recovery.

Alternatively, chemical vapor deposition (CVD) can be used to introduce permanent coatings and hence adjust the surface properties of PDMS. However, since this method requires unhindered access of the vapor to the substrate it is limited to the modification of non-assembled microfluidic chips. This is a significant drawback as the coating must then be stable enough to endure the bonding procedure typically involving plasma treatment.

Furthermore, PDMS surfaces can be modified covalently, most commonly via graft photo-polymerization. A simple one-step strategy is available which allows for the tailoring of PDMS surface properties by grafting various monomers. Again problems arise for assembled channels though, since polymerization predominantly occurs in the channel lumen rather than at the walls. The pre-adsorption of a suitable photo-initiator solves this problem, but requires additional preparation steps making the procedure more elaborate. Similarly, other covalent modification strategies, such as the generation of a glass coating via sol-gel methods offer the possibility to modify PDMS permanently, but again in a rather complex, labor-intensive and time-consuming manner.

Another surface modification method is based on the layer-by-layer (LbL) self-assembly of polyelectrolyte multilayers (PEMs) by alternate adsorption of polycations and polyanions. This versatile approach was introduced by the group of Decher [G. Decher, J. D. Hong, J. Schmitt, *Thin Solid Films*, 1992, 210/211, 831-835; G. Decher, Y. Lvov, J. Schmitt, *Thin Solid Films*, 1994, 244, 772-777; G. Decher, *Science*, 1997, 277, 1232-1237].

Based on these results Katayama et al [H. Katayama, Y. Ishihama, N. Asakawa, *Anal. Chem.*, 1998, 70, 2254-2260; H. Katayama, Y. Ishihama, N. Asakawa, *Anal. Chem.*, 1998, 70, 5272-5277] developed an LbL procedure allowing for the treatment of capillary inner walls. Various other groups like Barker et al, [S. L. R. Barker, M. J. Tarlov, H. Canavan, J. J. Hickman, L. E. Locascio, *Anal. Chem.*, 2000, 72, 4899-4903; S. L. R. Barker, D. Ross, M. J. Tarlov, M. Gaitan, L. E. Locascio, *Anal. Chem.*, 2000, 72, 5925-5929.] Henry et al [Y. Liu, J. C. Fanguy, J. M. Bledsoe, C. S. Henry, *Anal. Chem.*, 2000, 72, 5939-5944] and Hahn et al. [K. W. Ro, W.-J. Chang, H. Kim, Y.-M. Koo, J. H. Hahn, *Electrophoresis*, 2003, 24, 3253-3259] are using similar protocols in order to modify surface properties of microfluidic channel walls. However, all of these coating procedures rely on the manual flushing of a microfluidic chip with different polyelectrolyte solutions. As additional washing steps need to be carried out in between and all polyelectrolyte and washing solutions have to be individually injected into the device, kept inside the channels for some time and removed afterwards this method can easily become a tedious and labor-intensive task, too. Weitz et al. (A. R. Abate, D. A. Weitz, Small 2009, 5, 2030) have used photolithographic techniques to realize alternating wettability profiles inside microchannels for producing multiple emulsions.

Further background prior art can be found in U.S. Pat. No. 6,860,980, US2002/0053514, US2004/0084312, U.S. Pat. No. 6,402,918, and WO2005/052035.

There is therefore a need for improved techniques for surface modification of channels of a microfluidic device.

SUMMARY OF THE INVENTION

According to the present invention there is therefore provided a method of layer-by-layer deposition of a plurality of layers of material onto the walls of a channel of a microfluidic device, the method comprising: loading a tube with a series of segments of solution, a said segment of solution bearing a material to be deposited; coupling said tube to said microfluidic device; and injecting said segments of solution into said microfluidic device such that said segments of solution pass, in turn, through said channel depositing successive layers of material to perform said layer-by-layer deposition onto said walls of said channel.

In preferred embodiments of the method the tube is loaded so that there are gas, typically air, gaps between successive segments of solution, to act as spacers to thereby inhibit mixing of the solution in adjacent segments. In embodiments segments of solution bearing material to be deposited have segments of washing fluid between them, for example, water and/or an aqueous washing solution.

In embodiments the tube is loaded by coupling an end of the tube to each of a set of solutions in turn in reverse order to that in which the solutions are to be pumped through the microfluidic device (so that the tube need not be turned around once loaded). In embodiments of the method the solution is injected at a controlled, for example, constant flow rate. In this way the duration of the deposition of a layer can be controlled by controlling the flow rate and physical length of a segment of solution bearing the material to be deposited.

In embodiments the channel of the microfluidic device is defined in a plastic, and the method further comprises pre-treating this plastic channel by exposure to an energy source, for example a plasma, to generate a hydrophilic surface for the channel. As previously mentioned this hydrophilic surface can undergo hydrophobic recovery and therefore, in embodiments of the method, the layer-by-layer deposition is commenced before this hydrophobic recovery has proceeded more than 10%, 20%, 30%, 40% or 50%.

In embodiments the plastic may comprise PDMS, but embodiments of the method are also suitable for many other plastic/polymer materials, including but not limited to: polystyrene, PETG (Poly(ethylene terephthalate glycol)), PMMA (poly(methacrylate)) and polycarbonate.

In preferred embodiments of the method the material to be deposited comprises polyelectrolyte. The skilled person will be aware of many suitable materials in some preferred implementations of the method the polyelectrolyte solutions comprise solutions of positively and negatively charged polyelectrolytes, for example PAH and PSS respectfully. In this way alternating positively and negatively charged polyelectrolyte layers may be deposited on the walls of the microchannel to provide a multilayer coating. In embodiments the segments of polyelectrolyte are separated by aqueous washing solution and a gas (air) gap at either or both ends. The skilled person will be aware, however, that embodiments of the above described technique may be employed to deposit a layer or layers of many other different materials.

The invention also provides a method of fabricating a microfluidic device including treating one or more channels of the device as described above. The invention further provides a microfluidic device fabricated using or treated by a method as described above.

Embodiments of the above described method are particularly advantageous for treating the device for processing droplets of an emulsion in an aqueous stream of fluid, such as an oil-in water emulsion.

The invention also provides apparatus for layer-by-layer deposition of a plurality of layers of material onto the walls of a channel of a microfluidic device, the apparatus comprising: a system for loading a tube with a series of segments of solution, a said segment of solution bearing a material to be deposited; and a system for injecting said segments of solution into said microfluidic device such that said segments of solution pass, in turn, through said channel depositing successive layers of material to perform said layer-by-layer deposition onto said walls of said channel.

In embodiments the system for injecting the solution segments into the microfluidic device may comprise a controlled-rate pump, for example, a syringe pump; the same or a similar arrangement may be employed for loading the tube with the segments of solution prior to injection. In embodiments the tubing comprises a length of replaceable flexible tubing, for example of plastic, which may conveniently be cut to remove unwanted contamination. Additionally or alternatively a fluid switch or multiplexer may be employed to selectively couple the tubing to a plurality of reservoirs bearing solutions to be loaded into the tube and/or to selectively couple the tube to a microfluidic device to be treated.

As described further below, embodiments of these techniques may also be employed to provided microfluidic devices suitable for the production of double emulsions, in particular (water in oil) in water emulsions. Thus embodiments of the above described methods may comprise flowing the segments of solution alongside a second fluid such that the layers of material from the layer-by-layer deposition process are selectively deposited on a lateral portion of the channel. More particularly the two fluids/flows are chosen or configured such that the two fluids flow alongside one another without substantial mixing and in a relatively stable joint flow pattern so that one longitudinal side of the channel (one or more walls or a portion of a curved side wall) is selectively coated. Depending on the second fluid flow the remaining longitudinal side portion of the channel may or may not be coated or otherwise modified.

Thus in a further aspect the invention provides a method of providing a surface modification pattern on the wall or walls of at least one channel of a microfluidic device, the method comprising: flowing first and second fluids through said channel of said microfluidic device such that within said channel said first and second fluids remain substantially unmixed with one another and define a substantially stable joint fluid flow pattern; and providing at least one of said fluid flows with a surface modification agent such that said wall or walls of said channel are modified by said surface modification agent to acquire a surface modification pattern defined by said joint fluid flow pattern.

In embodiments the surface modification pattern may comprise modification of a surface energy of the channel, for particularly to make a portion of the side wall or walls of the channel hydrophilic or hydrophobic. In embodiments this may be achieved by selectively depositing material on one or another lateral side of the channel, in particular layer-by-layer as described above, but in other approaches other techniques for surface energy modification may be employed. Although two fluids are employed in some preferred embodiments, in principle flows of more than two fluids which form a relatively stable flow pattern and remain substantially mutually separate from one another may be used.

In some preferred implementations of the method the first and second fluids are provided in respective first and second channels which provide inlets to a fluid flow junction from which one, two or more third channels provide an outlet or outlets. Surface modification patterning takes place in the joint fluid flow in the third channel(s), so that one side of a third channel is modified and another side, for example the opposite side, of the third channel remains substantially unmodified or is modified in a different way. As previously mentioned the surface modification may comprise providing the surface with a hydrophilic or hydrophobic surface modification, for example a surface coating, in particular a layer-by-layer coating using a method as described above.

The two fluid flows may both comprise liquid fluid flows or one of the fluids may comprise a gas (which here includes air). The fluids should be substantially immiscible in the microfluidic channel, but this does not necessarily mean that they are immiscible under all conditions—for example the surface energy of one or both of the fluids may mean that within the narrow confines of the channel it is energetically unfavourable for the fluids to mix.

In embodiments the method is performed in a microfluidic device configured to form a double emulsion. Thus a combination of a said first, second and third channel and junction may form a flow focussing region for forming a droplet of the emulsion, and a pair of such flow focussing regions may be employed, one downstream of the other, to form a double emulsion. In this way, for example, the first flow focussing region may be employed to form a droplet of water in oil and the second flow focussing region to form a double emulsion comprising a droplet of oil in water wherein the oil itself comprises one (or more) water droplets.

Thus in a related aspect the invention provides a microfluidic device having at least, first, second and third fluid flow channels, said first and second channels providing inlets to a fluid flow junction and said third channel providing an outlet from said fluid flow junction, and wherein said third channel has a surface modification pattern such that a first longitudinal side of said third channel is more hydrophilic than a second, opposite longitudinal side of said third channel and said second longitudinal side of said third channel is more hydrophobic said first longitudinal side of said third channel.

In embodiments the device comprises pair of flow focussing regions as described above, one downstream of the other, such that the device is configured to form a double emulsion.

The invention also provides a method of forming a double emulsion using such a device. In embodiments of the method the device is controlled or driven such that the droplet formation at the first and second flow focussing regions is substantially in synchronism, for example by arranging for the droplet formation in these two regions to proceed at substantially the same rate.

BRIEF DESCRIPTION OF THE DRAWINGS

These and other aspects of the invention will now be further described, by way of example only, with reference to the accompanying figures in which:

FIGS. 2a and 2c shows fluorescence analysis of automated LbL (layer-by-layer) PDMS surface modification showing, respectively, (a) schematics of flushing sequences with varying number n of fluorescently labelled PAH segments, (b) fluorescence microscopic image of four straight microfluidic channels (fluorescence intensity increases with increasing n), (c) fluorescence microscopic analysis of a wiggle channel reveals a homogeneous coating even for this geometry;

FIGS. 3a to 3d show the influence of PDMS surface modification on the formation and stability of oil-in-water droplets, scale bar=100 µm, respectively (a), (b) without further treatment of the channels instabilities and phase reversion occur; (c), (d), after LbL deposition of a PEM—the PDMS surface maintains its hydrophilicity even after 2.5 weeks of storage under air allowing for the formation of monodisperse and stable droplets;

DETAILED DESCRIPTION OF PREFERRED EMBODIMENTS

Figure 1:
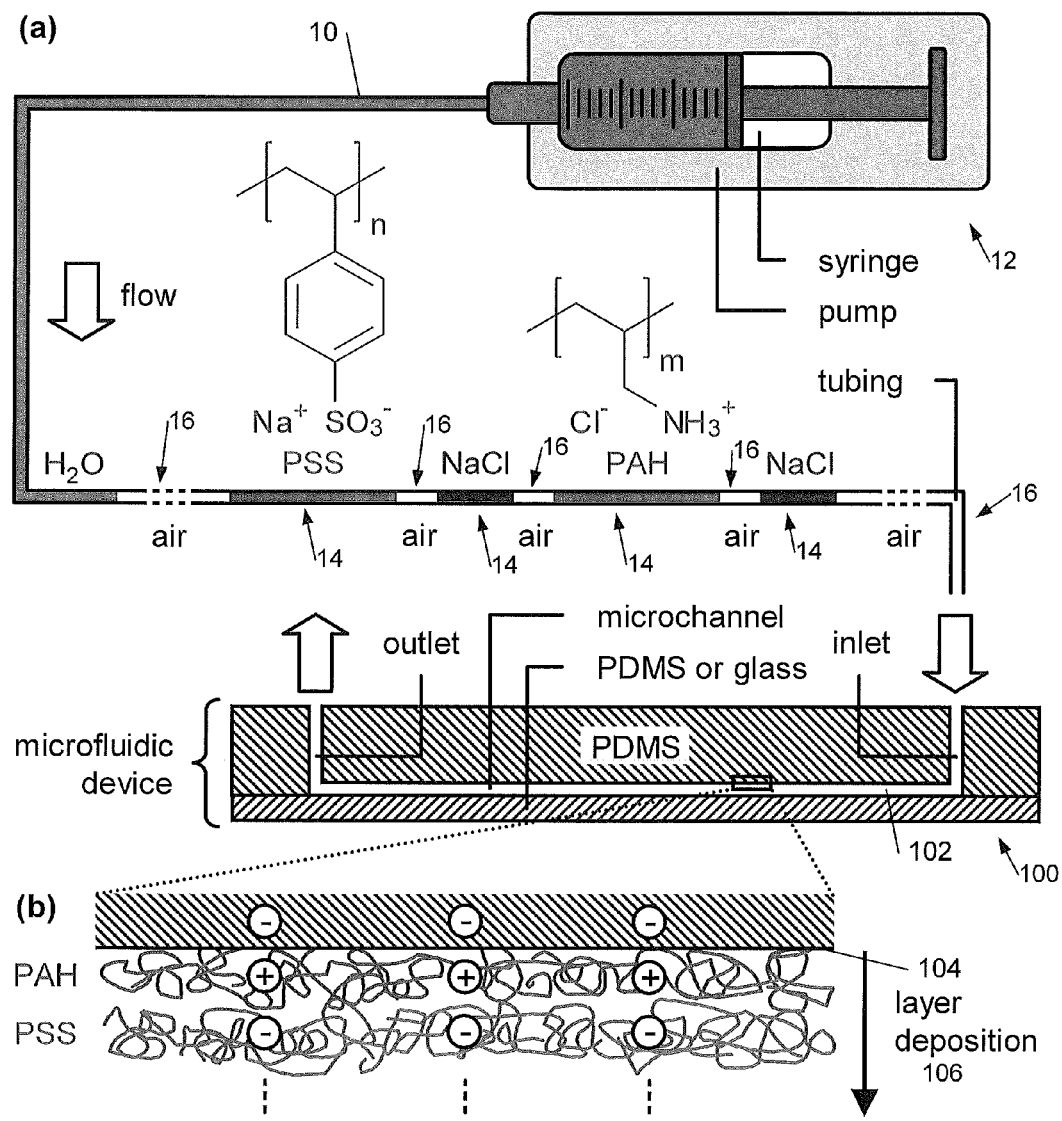
FIGS. 1a and 1b show, respectively, a schematic diagram illustrating a method and apparatus according to an embodiment of the invention, and a cross section through a treated wall of a microfluidic channel.

We will describe a LbL approach which provides time-saving, automated surface modification process (FIG. 1) and which allows for the creation of stable oil-in-water droplets (in droplet-based fluidics, the presence of biphasic flow puts great demands on the uniformity and surface energy of the channel coating). FIG. 1 shows a schematic illustration of the automated LbL surface modification of a microfluidic channel 102 of a microfluidic chip 100. In FIG. 1a defined segments of aqueous solutions of NaCl, a positively and a negatively charged polyelectrolyte (PAH and PSS, respectively), separated by air and stored within the tubing, are sequentially flushed through the microfluidic channel at a constant flow rate. In FIG. 1b at the PDMS surface a coating of alternating positive and negative polyelectrolyte layers is successively built up.

A key feature is the loading of a piece of tubing 10 with defined solution segments 14, separated by air. In this regard, one end of the tubing is attached to a syringe 12 and the other end is dipped into the solution which shall enter the channel last later on. Having withdrawn a solution segment of a certain length into the tubing the latter is pulled out of the solution. An air segment 16 is drawn in and the contaminated part of the tubing which was in contact with the solution is simply cut off. The next solution segment can be sucked in likewise and so on. In order to build up a polyelectrolyte multilayer 106 we load the tubing alternately with segments of poly(allylamine hydrochloride) (PAH) and poly(sodium styrene sulfonate) (PSS) solutions (1 mg polyelectrolyte in 1 ml 0.5 M aqueous NaCl solution in both cases) with 0.1 M aqueous NaCl washing solution segments in between. But the concept can of course be applied for all imaginable combinations of solutions. The loading of the tubing with the desired number of segments is the only task within the procedure which is, in embodiments, carried out manually but usually takes no longer than 10 minutes (in other implementations this may be automated). Subsequently, the tubing is connected to the microfluidic chip 100 directly after plasma treatment and assembly, when the channel walls 104 are still hydrophilic. Using a syringe pump 12 the segments successively enter the chip, flush it and are blown out again by the respective following air segment in a completely automatic fashion. Applying a constant flow rate the length of the individual segment precisely determines the time the corresponding solution stays inside the microchannel. The final washing step is performed with distilled water in order to remove traces of salt from the channel walls.

We were already able to show the successful operation of this concept (FIG. 2) Within a fluorescence study we systematically varied the number n of fluorescently labeled PAH segments within the tubing FIG. 2a). The analysis of the microchannels under the fluorescence microscope revealed an increase in fluorescence intensity with increasing numbers of labeled segments FIG. 2b). This shows that we are able to build up PEMs onto the channel walls in a controlled manner. Our automated LbL approach is not limited to straight channels but also allows for a homogeneous coating of more complex geometries FIG. 2c).

Furthermore, we studied extensively the effects of channel surface properties on the formation and stability of oil-in-water droplets. Referring to FIG. 3, when the PDMS is not further modified after plasma treatment the hydrophobic recovery leads to instabilities and even phase reversion within no more than one hour, even if the experiment is started immediately after oxidation and chip assembly FIGS. (3a), (3b). In contrast, when depositing a PEM by our automated procedure the hydrophilicity is preserved and stable, monodisperse oil-in-water droplets can be formed even after storing the device under air for at least 2.5 weeks after modification FIGS. (3c), (3d).

Since our automated surface modification method deals with a fundamental issue in microfluidics, i.e. the fast creation of hydrophilic PDMS channels with long-term stability, the possible benefits are substantial. Whenever well-defined oil-in-water droplet are to be generated in microfluidic devices, e.g. for organic synthesis or for the creation of nano- and microparticles, our approach is a potentially useful option. Being not restricted to surface modification based on polyelectrolyte solutions and allowing for the selective modification of certain channels within one chip our technique also opens up new avenues for applications beyond the examples described above. Broadly speaking we have described a new automated technique for the modification of PDMS microchannels. Embodiments of the method may be employed with channels of a range of sizes, but are preferably employed with (microfluidic) channels having a maximum transverse dimension of less than 1 mm (often less than 500 μm or 300 μm), and may be employed with much smaller channels, for example less than 1 μm maximum transverse dimension. Embodiments of the methods combine a convenient and time-saving process on the assembled chip with versatility and long-term channel hydrophilicity. Microfluidic devices are configured for laminar flow and typically have a Reynolds number of <30, <10, <2 or <1.

Applications of embodiments of the invention are not limited to chips and may be employed with other microfluidic systems including, but not limited to: inkjet print heads, microarrays and other chemical/biochemical sensors and, more generally, to a range of microfluidic systems for handling fluids. Embodiments are, however, particularly advantageous for on-chip microfluidic structures such as so-called lab-on-a-chip (LOC) devices.

Surface Patterning Via Selective LbL Deposition for the Production of Double Emulsions Having previously described our LbL deposition technique for the production of oil/water (o/w) microdroplets we now address the fabrication of more complex devices that can generate double emulsions. Especially water/oil/water double emulsions are highly attractive systems as they have great potential for applications, for instance as delivery systems for pharmacological compounds. As bulk preparation methods usually yield water/oil/water droplets with a broad size distribution a microfluidic approach is advantageous when monodisperse double emulsions are required. This is not trivial as two droplet production processes have to be precisely controlled. In order to engulf a defined number of small water droplets into the bigger oil droplets both formation frequencies should be synchronized. This is done best when performing both processes on a single microfluidic chip. However, when using PDMS-based devices the wettability of the channel surface poses another challenge. For the formation of the inner water droplets the channel wall should be hydrophobic whereas for the production of the outer oil droplets hydrophilic surface properties are desirable. Hence, the surface energy of the microchannel should be patterned.

Figure 4:
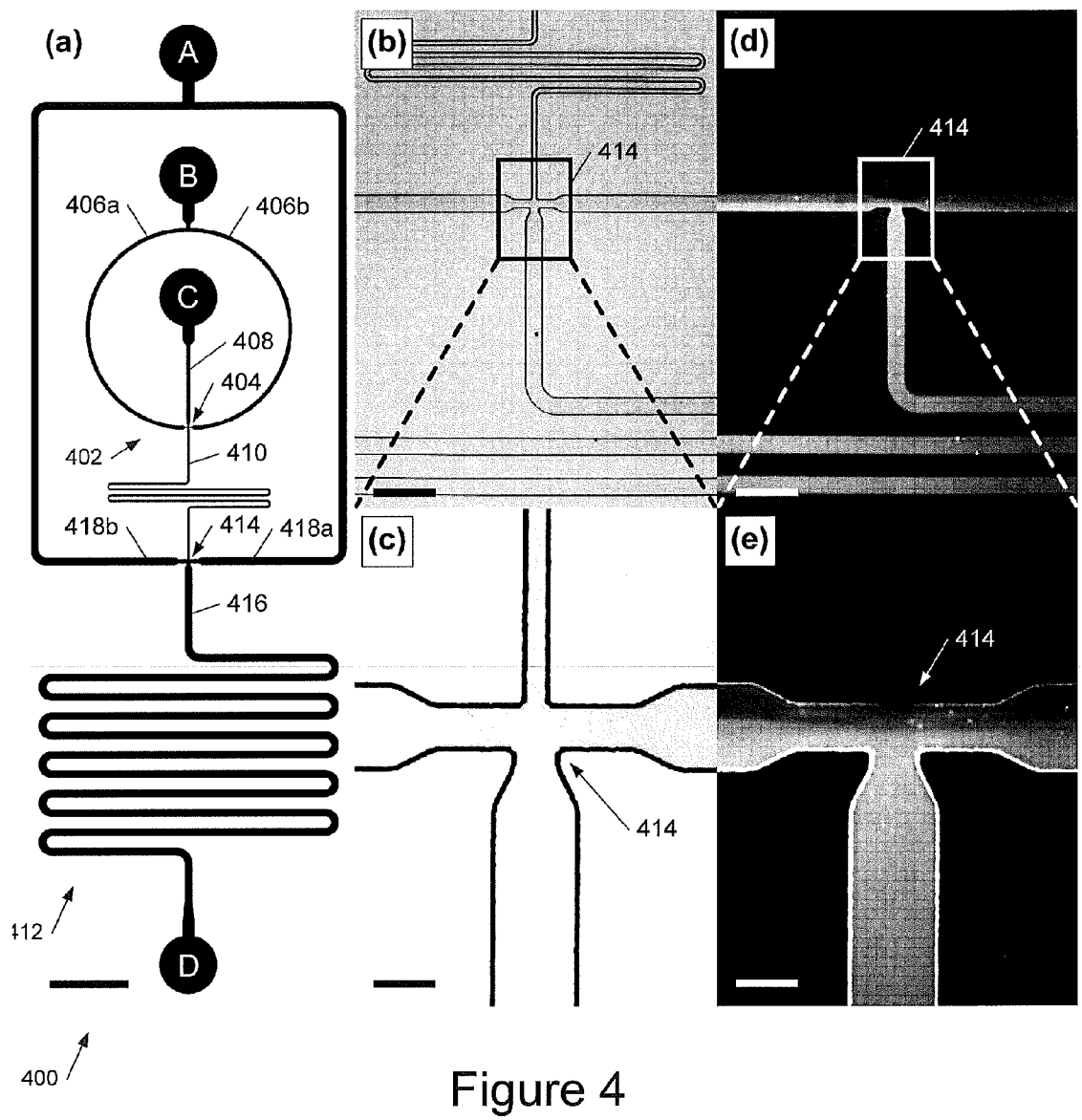
FIG. 4 shows selective hydrophilic surface coating of certain parts of the microchannel showing (a) a schematic illustration of a microfluidic device used for the generation of water/oil/water double emulsions (for hydrophilic surface treatment a polyelectrolyte sequence was flushed through inlet D, while deionised water (DIW) was injected through inlet B; inlet C was blocked and A was used as an outlet); (b and c) show bright field micrographs of the microfluidic device after hydrophilic surface treatment; and (d and e) show corresponding fluorescence micrographs of the microfluidic device after hydrophilic surface treatment (only the lower part of the microchannel was coated with a fluorescent PEM; no deposition occurred within the upper part; scale bars denote (a) 2 mm, (b) 750 µm; (c) 150 µm, (d) 750 µm and (e) 150 µm)

We have used the above described LbL deposition technique to selectively apply a hydrophilic channel coating in certain areas of the microfluidic device (FIG. 4). In FIG. 4(a) a schematic diagram of a microfluidic device (chip) 400 capable of forming double emulsions is shown. The microchannel device comprises a narrow channel part 402 (upper part; 50 μm wide channels) with a first flow focusing region (junction) 404 where channels 406a,b; 408 from inlets B and C meet and having an outlet channel 410; and a wider channel part 412 (lower part; 200 μm wide channels). These sections meet at a second flow-focusing region (junction) 414 at which the outlet channel 410 from the first flow focusing region and (in the illustrated example) a pair of channels 418a,b from inlet A meet. An outlet channel 416 from the second flow-focusing region (junction) to outlet D is provided. At the second flow-focusing region 414 the incorporation into, preferably the enclosure of, the small water droplets into larger oil droplets, and hence wettability reversal, should occur. In order to produce stable w/o/w double emulsions the wider (lower) part should be turned hydrophilic selectively over the narrower (upper) one. Directly after device assembly we injected a polyelectrolyte sequence containing FITC (fluorescein isothiocyanate) labeled PAH in inlet D and flushed it through the lower part of the chip at a constant flow rate of 50 μL h$^{-1}$. Simultaneously we blocked the upper part of the device by streaming DIW through inlet B at 100 μL h$^{-1}$. Inlet C was closed during the modification process while A was used as an outlet.

By means of fluorescence microscopy we analyzed the microfluidic device after this hydrophilic treatment. FIG. 4(b) and FIG. 4(c) show bright field micrographs of the area around the second flow-focusing region. The corresponding fluorescence micrographs in FIG. 4(d) and FIG. 4(e) reveal that only in the designated lower part of the microchannel a fluorescent PAH-PSS-PAH-PSS PEM was deposited. In contrast, the absence of a fluorescence signal in the upper part of the chip shows that no LbL coating took place there. The boundary between the modified and the non-modified channel section can be located at the second flow-focusing region. These results demonstrate that following our LbL surface modification method we are able to partially coat the microchannel wall with a hydrophilic PEM in a precise and spatially defined manner. No lithographic tools are needed, a flow pattern is transferred instead. The partial surface modification technique we describe is very robust for the geometries tested here, and could be extended to more complicated channel designs, e.g. chips with multiple flow-focusing junctions.

In a second surface modification step we produced a defined hydrophobic surface in the upper part of the microchannel. Again we used flow patterning to achieve a partial coating. In a reversed setup compared to the hydrophilic modification step we slowly injected the commercial water repellent agent Aquapel through inlet B at 20 μL h$^{-1}$. A stream of air was blown in the channel through inlet D at 5000 μL h$^{-1}$ to inhibit Aquapel from interfering with the PEM deposited in the lower part of the chip. While inlet C was blocked during this process A was used as an outlet.

Figure 5:
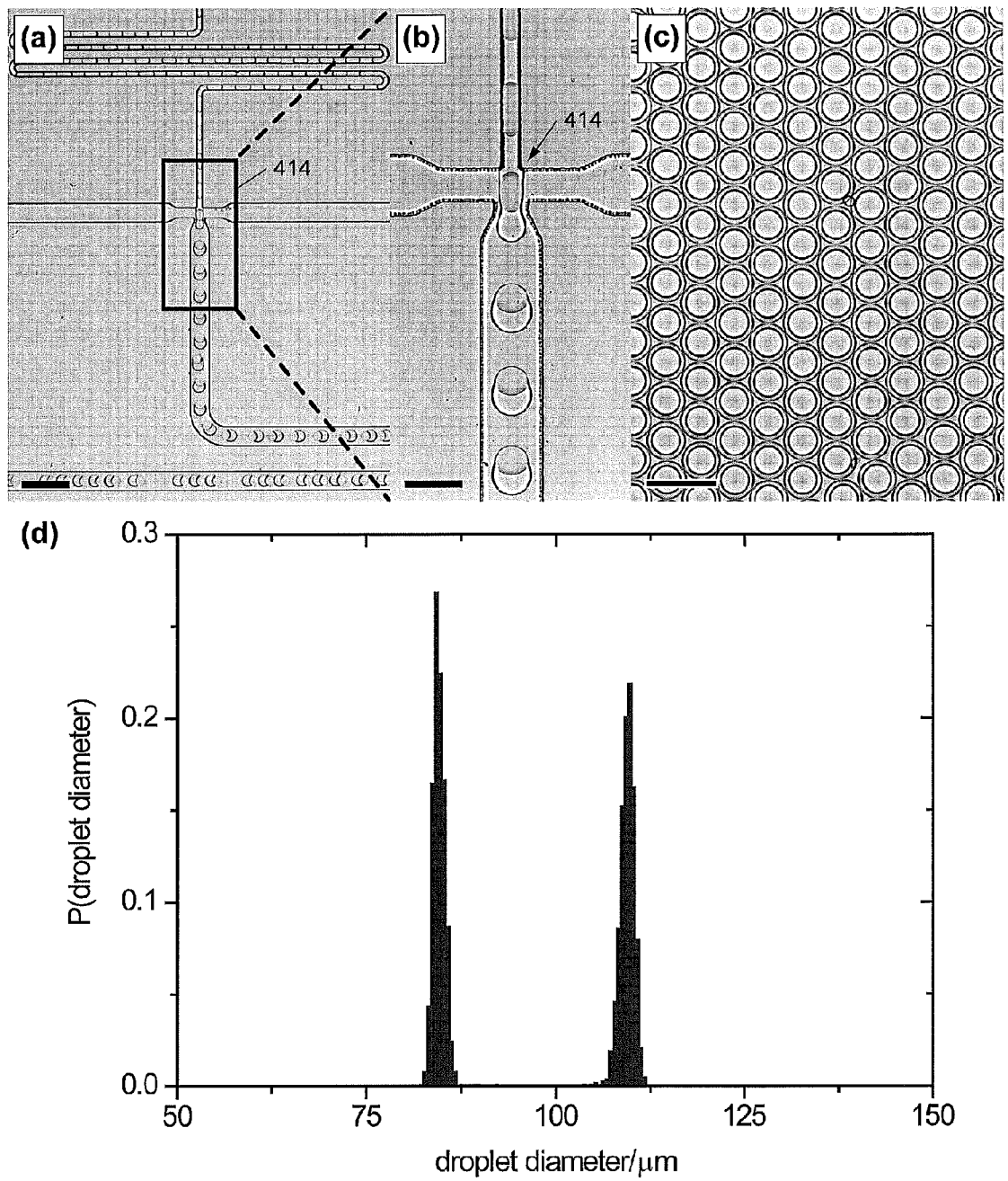
FIG. 5 shows production of a water/oil/water (w/o/w) double emulsion using a partially hydrophilic, partially hydrophobic device showing (a and b) micrographs of stable enclosing of small water droplets in the bigger oil droplets, (c) a micrograph depicting a hexagonal close-packed monolayer form adopted by the w/o/w emulsion in a storage device, and (d) a diameter distribution showing a high level of droplet monodispersity both for the inner and the outer droplets (scale bars denote (a) 500 µm; (b) 200 µm and (c) 200 µm).

Subsequently, we used the resultant partially hydrophilic, partially hydrophobic device for the production of a w/o/w double emulsion (FIG. 5). DIW (deionised water) containing 0.5% w/w SDS (sodium dodecyl sulphate) was injected as the outermost phase through inlet A at 1500 μL h$^{-1}$. Through inlet B we flushed the fluorous oil FC-40 containing 2.0% w/w EA surfactant (C. Holtze, A. C. Rowat, J. J. Agresti, J. B. Hutchison, F. E. Angilè, C. H. J. Schmitz, S. Köster, H. Duan, K. J. Humphry, R. A. Scanga, J. S. Johnson, D. Pisignano and D. A.

Weitz, Lab Chip 2008, 8, 1632) at a flow rate of 200 μL h$^{-1}$. Pure DIW was used as the innermost phase and applied through inlet C at 150 μL h$^{-1}$. In FIG. 5(a) and (b) the formation of the double emulsion is depicted. DIW in oil droplets formed at the first flow-focusing region travel smoothly through the upper part of the channel. The microchannel wall is wetted by the fluorous oil indicating that the Aquapel treatment was successful. At the second flow-focusing region every DIW droplet is enclosed in a larger oil droplet. Substantially no oil droplet stays empty since both droplet formation steps proceed at the same frequency (in an example, of 130 Hz). The double emulsion droplets proceed through the lower part of the microchannel without any wetting problems. During the whole observation period of 90 min no signs of degradation in hydrophilic surface properties occurred.

The resultant double emulsion was extruded through outlet D and collected for 30 min. A small fraction of ca. 5 μL was injected into a storage device. FIG. 5(c) shows a micrograph of the hexagonal close-packed monolayer adopted by the double emulsion droplets inside the reservoir. The droplet diameter distribution of 1107 droplets, shown in FIG. 5(d), is extremely narrow for both the inner water and the outer oil droplets and yields mean values of 84.6 μm and 109.4 μm, respectively. The standard deviations, 0.8 μm for the inner and 1.0 μm for the outer droplets, are below 1% of the corresponding average diameter, showing the high level of monodispersity in both cases.

In this experimental study we showed that our LbL surface deposition technique is not limited to simply turning a complete microchannel hydrophilic: It is also possible to precisely pattern the surface energy within an assembled channel or channels. One application is the fabrication of semi-hydrophilic, semi-hydrophobic microfluidic devices capable of producing highly monodisperse w/o/w double emulsions.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of layer-by-layer deposition of a plurality of layers of material onto the wall or walls of a channel of a microfluidic device, the method comprising:
   loading a tube with a series of segments of solution, a said segment of solution bearing a material to be deposited;
   coupling said tube to said microfluidic device; and
   injecting said segments of solution into said microfluidic device such that said segments of solution pass, in turn, through said channel depositing successive layers of material to perform said layer-by-layer deposition onto said wall or walls of said channel.

2. A method as claimed in claim 1 wherein said loading further comprises loading said tube with gas between said segments of solution to separate said segments of solution.

3. A method as claimed in claim 1 wherein said loading further comprises loading said tube with a segment of washing fluid between two of said segments of solution bearing material to be deposited.

4. A method as claimed in claim 1 wherein said loading comprises coupling an end of said tube to each of a set of said solutions in turn in a reverse order to an order in which materials in said solutions are to be deposited and withdrawing said segments of said solution into said tube.

5. A method as claimed in claim 1 wherein said injecting comprises injecting at a controlled rate, and further comprising controlling a duration of deposition of a said layer using a combination of said controlled rate and a physical length of a said segment in said tube.

6. A method as claimed in claim 1 wherein said channel of said microfluidic device is defined in a plastic, the method further comprising pre-treating said plastic channel by exposure to an energy source to generate a hydrophilic surface on said wall or walls of said channel, wherein said hydrophilic surface undergoes hydrophobic recovery, and wherein of said layer-by-layer deposition of said plurality of layers of material is started prior to 50% hydrophobic recovery of said hydrophobic surface.

7. A method as claimed in claim 1 wherein said loading of said tube comprises loading said tube with successive said segments of solution comprising, alternately, positively and negatively charged polyelectrolyte each separated by washing solution and at least one gap segment from which fluid is substantially absent.

8. A method as claimed in claim 1 further comprising flowing said segments of solution alongside a flow of a second fluid in said channel such that said plurality of layers of material are selectively deposited on a lateral portion of said channel.

9. A method of using a microfluidic device to process droplets of an emulsion in an aqueous stream of fluid, the method comprising depositing a plurality of layers of material onto the wall or walls of a channel of the microfluidic device using the method of claim 1 to render said wall or walls hydrophilic, and processing said droplets of said emulsion by passing said aqueous stream through said channel of said microfluidic device.

10. A method of fabricating a microfluidic device comprising treating the microfluidic device using the method of claim 1.

11. A method of providing a surface modification pattern on the wall or walls of, at least one channel of a microfluidic device, the method comprising:
   flowing first and second fluids through said channel of said microfluidic device such that within said channel said first and second fluids remain substantially unmixed with one another and define a substantially stable joint fluid flow pattern; and
   providing at least one of said fluid flows with a surface modification agent such that said wall or walls of said channel are modified by said surface modification agent to acquire a surface modification pattern defined by said joint fluid flow pattern,
   wherein said flowing comprises flowing said first fluid along a first channel towards a fluid flow junction and flowing said second fluid along a second channel towards said fluid flow junction and wherein said joint fluid flow pattern comprises a joint flow of said first and second fluids away from said junction in a third channel, wherein said first and second fluids flow alongside one another in said third channel such that said wall or walls on one longitudinal side of said third channel are provided with said surface modification pattern.

12. A method as claimed in claim 11 wherein said microfluidic device comprises a device for forming a double emulsion having first and second flow-focussing regions, each with a respective said first, second and third channel and junction, and wherein the method comprises providing said surface modification pattern in said third channel of one or both of said first and second flow-focussing regions.

13. A method as claimed in claim 11 wherein said surface modification pattern comprises a surface coating pattern, and wherein said fluid flow provided with said surface modification agent comprises a fluid flow bearing a material to perform layer-by-layer deposition of said surface coating pattern.

* * * * *